United States Patent
Komatsu et al.

(10) Patent No.: US 9,130,463 B2
(45) Date of Patent: Sep. 8, 2015

(54) DRIVE CIRCUIT FOR SWITCHING ELEMENT

(75) Inventors: Takeyasu Komatsu, Chiryu (JP); Yoshiyuki Hamanaka, Kariya (JP); Tsuneo Maebara, Nagoya (JP); Ryotaro Miura, Aichi-ken (JP)

(73) Assignee: DENSO CORPORATION, Kariya (JP)

( * ) Notice: Subject to any disclaimer, the term of this patent is extended or adjusted under 35 U.S.C. 154(b) by 835 days.

(21) Appl. No.: 13/430,804

(22) Filed: Mar. 27, 2012

(65) Prior Publication Data

US 2012/0249020 A1 Oct. 4, 2012

(30) Foreign Application Priority Data

Mar. 28, 2011 (JP) ................................. 2011-069485
Feb. 2, 2012 (JP) ................................. 2012-020636

(51) Int. Cl.
| H02P 1/00 | (2006.01) |
| H02M 1/32 | (2007.01) |
| H03K 17/082 | (2006.01) |
| H03K 17/0812 | (2006.01) |
| H02M 7/5387 | (2007.01) |

(52) U.S. Cl.
CPC .............. *H02M 1/32* (2013.01); *H03K 17/0828* (2013.01); *H03K 17/08128* (2013.01); *H02M 7/5387* (2013.01)

(58) Field of Classification Search
CPC .......... H02M 3/3385; H02M 3/33576; H02M 2001/009
See application file for complete search history.

(56) References Cited

U.S. PATENT DOCUMENTS

| 6,178,100 B1 * | 1/2001 | Kitano ............................ 363/19 |
| 2002/0071294 A1 * | 6/2002 | Yasumura .................. 363/21.02 |
| 2009/0002054 A1 | 1/2009 | Tsunoda et al. |
| 2009/0066402 A1 | 3/2009 | Hiyama |
| 2010/0232188 A1 * | 9/2010 | Hayasaki .................... 363/21.15 |
| 2011/0241581 A1 * | 10/2011 | Flock et al. ................. 318/400.3 |

FOREIGN PATENT DOCUMENTS

| JP | 2001-352748 | 12/2001 |
| JP | 2009-011049 | 1/2009 |
| JP | 2009-071956 | 4/2009 |

(Continued)

OTHER PUBLICATIONS

Office Action (2 pages) dated Apr. 23, 2013, issued in corresponding Japanese Application No. 2012-020636 and English translation (3 pages).

*Primary Examiner* — Shawki S Ismail
*Assistant Examiner* — Zoheb Imtiaz
(74) *Attorney, Agent, or Firm* — Nixon & Vanderhye PC (57) ABSTRACT

A drive circuit for a switching element includes a constant-current control unit and a restriction unit. The constant-current control unit performs a constant-current control for charging an open/close control terminal of a switching element to be driven which is a voltage-controlled switching element with electric charge for turning on the switching element. The restriction unit restricts, to a reference voltage, a voltage between the open/close control terminal and a first end of a pair of ends of a current flow path of the switching element for a predetermined period following a start of the constant-current control within a charging process period during which the open/close control terminal is charged with the electric charge such that the switching element is turned on.

16 Claims, 9 Drawing Sheets

(56) References Cited

FOREIGN PATENT DOCUMENTS

| JP | 2010-075007 | 4/2010 |
| JP | 2010-246251 | 10/2010 |
| JP | 2011-024368 | 2/2011 |

* cited by examiner

(NORMAL STATE)

(SHORT-CIRCUIT STATE)

DRIVE CIRCUIT FOR SWITCHING ELEMENT

CROSS-REFERENCE TO RELATED APPLICATION

This application is based on and claims the benefit of priorities from earlier Japanese Patent Application No. 2011-069485 filed Mar. 28, 2011 and No. 2012-020636 filed Feb. 2, 2012, the descriptions of which are incorporated herein by reference.

BACKGROUND OF THE INVENTION

1. Technical field of the Invention

The present invention relates to a drive circuit for a switching element, and in particular, to a drive circuit for a switching element including a constant-current control unit that performs a constant-current control for charging an open/close control terminal of a switching element to be driven which is a voltage-controlled switching element with electric charge for turning on the switching element.

2. Related Art

As a drive circuit for a switching element, there is proposed a circuit that uses a constant-current circuit to charge a gate of an insulated gate bipolar transistor (IGBT) to be driven, as disclosed by, for example, JP-A-2009-011049. The constant-current circuit is configured by using a direct current (DC) voltage source with a large enough terminal voltage as a power supply. This aims at keeping high controllability of constant-current control. The constant-current circuit can increase an upper limit of the gate voltage of the IGBT. Excessive increase in the upper limit may cause decrease in reliability of the gate oxide film of the IGBT. To avoid such a situation, based on the gate voltage of the IGBT, a constant voltage that is lower than the DC voltage source is applied to the gate.

However, when the IGBT to be driven is configured by a series connection of a switching element at a high-voltage side and a switching element at a low-voltage side, if abnormality where feedthrough current flows in the IGBT occurs, a switching to an on-state of the IGBT results in a rapid and excessive increase in current flowing in the IGBT. This leads to increase in the gate voltage of the IGBT, and therefore, prior to a switching to the constant voltage, such excessively large current as to cause decrease in reliability of the IGBT may flow in the IGBT.

SUMMARY

The present disclosure has been made in light of the problems set forth above and provides new drive circuit for a switching element including a constant-current control unit that performs a constant-current control for charging an open/close control terminal of a switching element to be driven which is a voltage-controlled switching element with electric charge for turning on the switching element.

According to an exemplary aspect of the present disclosure, there is provided a drive circuit for a switching element, comprising: a constant-current control unit that performs a constant-current control for charging an open/close control terminal of a switching element to be driven which is a voltage-controlled switching element with electric charge for turning on the switching element; and a restriction unit that restricts, to a reference voltage, a voltage between the open/close control terminal and a first end of a pair of ends of a current flow path of the switching element for a predetermined period following a start of the constant-current control within a charging process period during which the open/close control terminal is charged with the electric charge such that the switching element is turned on.

In the above disclosure, current capable of flowing in the switching element becomes larger, as a potential difference between the open/close control terminal and either one of the pair of ends in the current flow path of the switching element becomes larger. Due to this, if the potential difference is restricted, then the current flowing in the switching element can be restricted. From this, in the above disclosure, the potential difference is restricted to the reference voltage. This can avoid a situation where excessively large current flows in the switching element in association with a switching to the on-state of the switching element.

In the drive circuit, the restriction unit may start to restrict based on a condition that at least two physical quantities change in association with a command for turning on the switching element after an input timing of the command.

In the above disclosure, a condition for a start of the predetermined period is configured by a plurality of conditions. This can increase a resistance to noise of a judgment on whether to meet the condition for the start, compared with a case where the condition is configured by a single condition.

In the drive circuit, the physical quantities may include a detection value of the voltage between the open/close control terminal of the switching element and the first end of the pair, and the condition may include a condition that the detection value is equal to or more than a prescribed value which is more than zero.

In the drive circuit, the constant-current control unit may include a series connection of a constant-current resistor and a constant-current switching element which connected between the open/close control terminal and a direct current voltage source, and an operation unit that operates the open/close control terminal of the switching element such that an amount of voltage drop in the constant-current resistor is controlled to a target value, and the physical quantities may include at least one of a voltage in the open/close control terminal of the switching element, an amount of voltage drop between both ends of the constant-current resistor, and a potential in an input terminal and an output terminal of the constant-current switching element.

In the drive circuit, the physical quantities may include a detection value of the voltage between the open/close control terminal of the switching element (S*#) and the first end of the pair, and the condition includes a condition that the detection value is equal to or less than a prescribed value.

In the drive circuit, the physical quantities may include an operation signal of the switching element, and the condition includes a condition that the operation signal becomes a command for turning on the switching element.

In the drive circuit, the restriction unit may start to restrict based on a condition that at least two physical quantities, following an input timing of a command for turning on the switching element, change in association with the command.

The drive circuit may further include a current detection unit that detects current flowing in the switching element, and a prohibition unit that, if the current detected by the current detection unit is equal to or more than a threshold current, prohibits the restriction unit from releasing its restriction after the predetermined period passes.

In the above disclosure, in case of abnormality where current flowing in the switching element is equal to or more than the threshold current, the restriction unit is prohibited from releasing its restriction. This can reliably avoid a situation where current flowing in the switching element becomes further larger.

The drive circuit may further include a current detection unit that detects current flowing in the switching element, and a fail-safe unit that forcibly turns off the switching element, if the current detected by the current detection unit is equal to or more than a threshold current.

In the above disclosure, in case of abnormality where current flowing in the switching element is equal to or more than the threshold current, the switching element is forcibly turned off. This can reliably avoid a situation where current flowing in the switching element becomes further larger.

In the drive circuit, the reference voltage is set to be more than a voltage between the open/close control terminal of the switching element and the first end of the pair, where a saturation current associated with the voltage is a maximum current permitted to flow in the switching element on a normal drive of the switching element.

In the drive circuit, the restriction unit may include a series connection of a Zener diode and a clamp switching element which is located between the open/close control terminal of the switching element and the either one of the pair of ends.

DETAILED DESCRIPTION OF THE PREFERRED EMBODIMENTS

With reference to the accompanying drawings, hereinafter are described some embodiments of a drive circuit for a switching element, according to the present invention.

First Embodiment

Hereinafter, referring to FIGS. 1 to 4, a first embodiment is described. In the first embodiment, a drive circuit for a switching element according to the present invention is applied to a power conversion circuit connected to a vehicle's main machine mounted on a vehicle.

Figure 1:
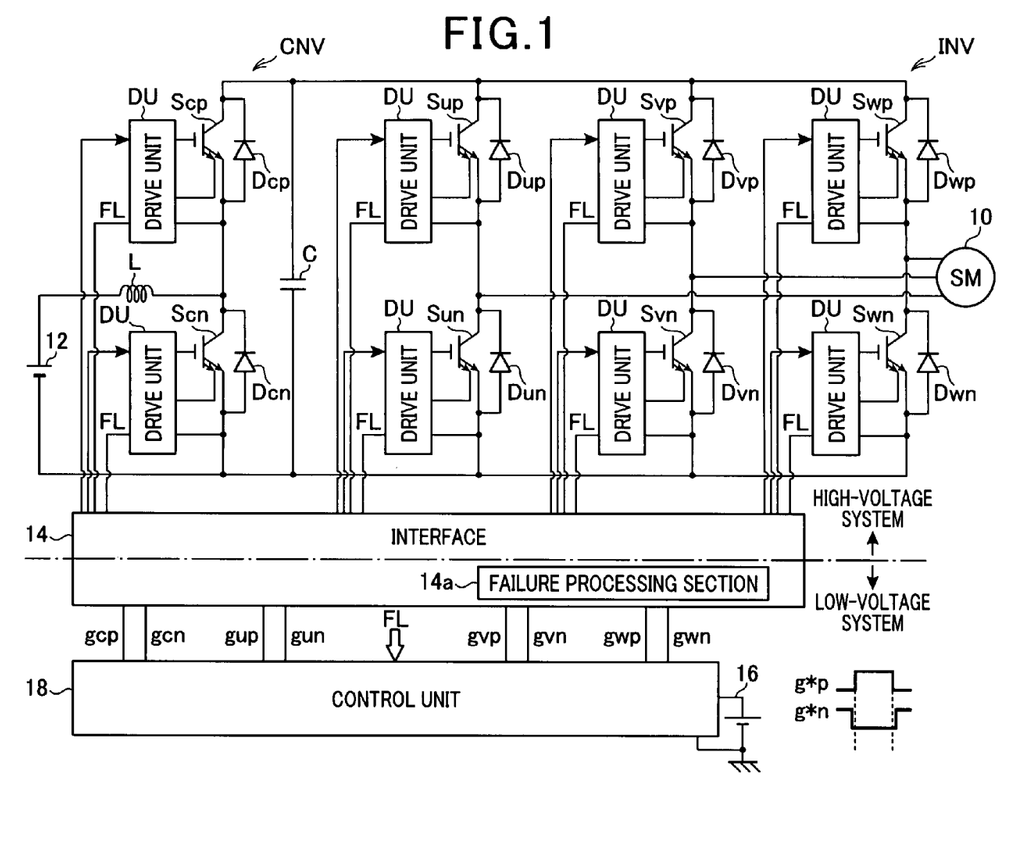
FIG. 1 is a schematic diagram illustrating a configuration of a system according to a first embodiment of the present invention.

FIG. 1 is a diagram illustrating a general configuration of a control system (motor system) for a vehicle's main machine, according to the present embodiment. A motor generator 10 is a vehicle's main machine which is mechanically connected to drive wheels of a vehicle, not shown. The motor generator 10 is also connected to a high-voltage battery 12 via an inverter INV and a step-up converter (also called a boost converter) CNV, which compose a power conversion circuit.

The step-up converter CNV includes a capacitor C, a pair of switching elements Scp and Scn, and a reactor L. The pair of switching elements Scp and Scn are connected parallel to the capacitor C. The reactor L connects the connecting point of the pair of switching elements Scp and Scn to the positive pole of the high-voltage battery 12. When the switching elements Scp and Scn are turned on/off, the voltage of the high-voltage battery 12 (e.g., 100 V or more) is stepped up, with a predetermined voltage (e.g., 666 V) as an upper limit.

The inverter INV includes a series connection of switching elements Sup and Sun, a series connection of switching elements Svp and Svn and a series connection of switching elements Swp and Swn. The connecting points of these respective series connections are connected to respective U, V and W phases of the motor generator 10. In the present embodiment, insulated gate bipolar transistors (IGBTs) are used as these switching elements S*# (*=u, v, w, or c; #=p or n). The switching elements S*# are in anti-parallel connection with respective diodes (free-wheel diodes) D*#.

A control unit 18 is a control unit using a low-voltage battery 16 as a power supply and controls the motor generator 10. The control unit 18 operates the inverter INV and the step-up converter CNV to desirably control the controlled variable of the motor generator 10. Specifically, the control unit 18 outputs operation signals gcp and gcn to drive units DU to control the switching elements Scp and Scn, respectively, of the step-up converter CNV. Further, the control unit 18 outputs operation signals gup, gun, gvp, gwp and gwn to drive units DU to control the switching elements Sup, Sun, Svp, Svn, Swp and Swn, respectively, of the inverter INV. The operation signals g*p on the high-potential side are complementary to the corresponding operation signals g*n on the low-potential side. In other words, the switching elements S*p on the high-potential side and the corresponding switching elements S*n on the low-potential side are alternately turned on.

A high-voltage system including the high-voltage battery 12 and a low-voltage system including the low-voltage battery 16 are insulated from each other. Signals are transmitted/received between these systems via an interface 14 that includes an insulating element, such as a photocoupler.

Figure 2:
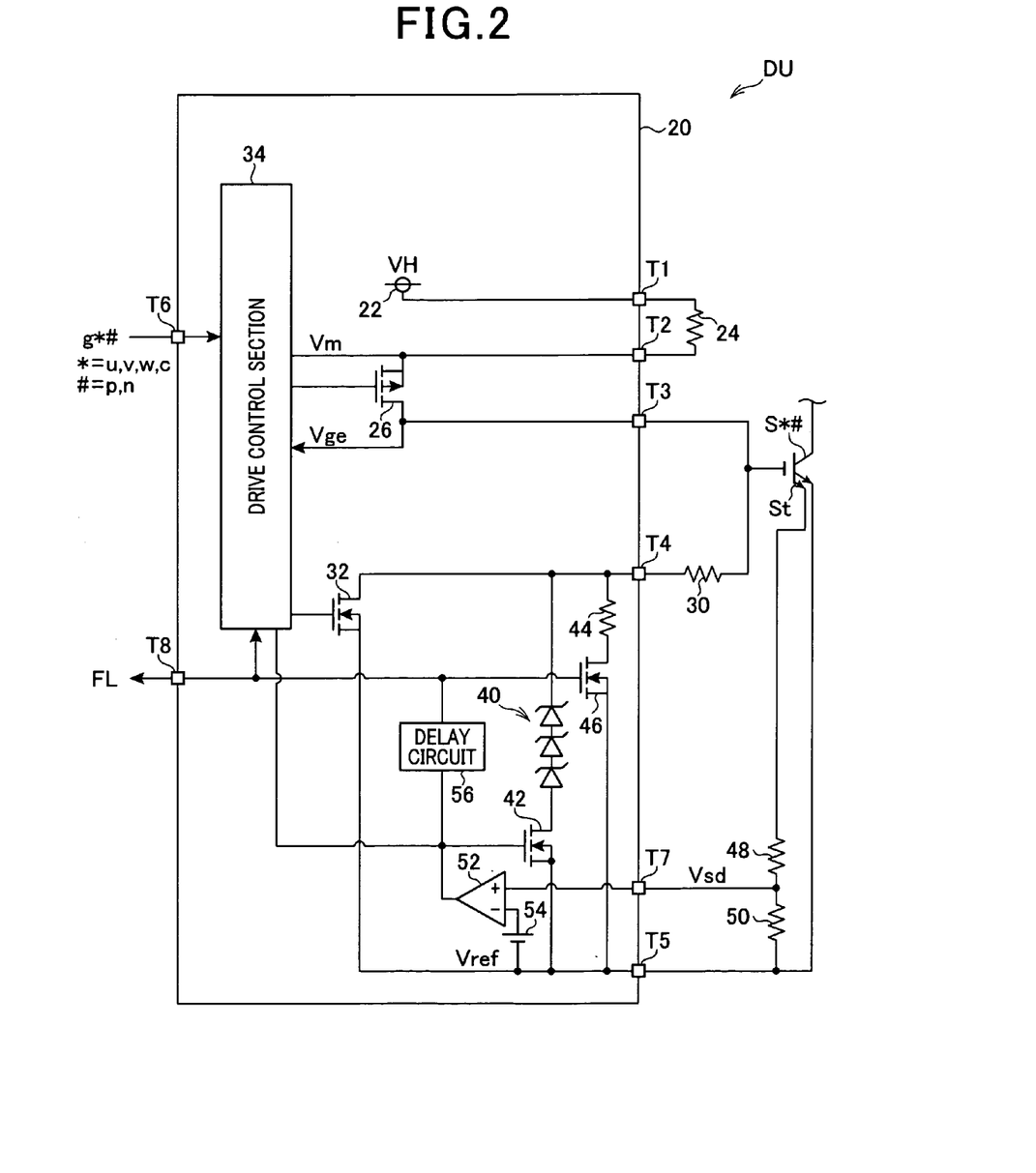
FIG. 2 is a circuit diagram illustrating a circuit configuration of a drive unit according to the first embodiment.

FIG. 2 is a circuit diagram illustrating a configuration of one of the drive units DU. As shown in FIG. 2, the drive unit DU includes a drive IC 20 that is a semiconductor integrated circuit designed for a single chip. The drive IC 20 includes a DC (direct current) voltage source 22 having a terminal voltage VH. A terminal of the DC voltage source 22 is connected to a gate (open/close control terminal) of the switching element S*# via a terminal T1, a constant-current resistor 24, a terminal T2, a p-channel MOSFET (metal-oxide-semiconductor field-effect transistor) (constant-current switching element 26), and a terminal T3.

On the other hand, the gate of the switching element S*# is connected to a terminal T5 via a gate resistor 30, a terminal T4, and an n-channel MOSFET (discharge switching element 32). The terminal T5 is connected to an output terminal (emitter) of the switching element S*#.

The constant-current switching element 26 and the discharge switching element 32 are operated by a drive control section 34 in the drive IC 20. Specifically, the drive control section 34 alternately turns on/off the constant-current switching element 26 and the discharge switching element 32 based on the operation signal g*# inputted via a terminal T6 to thereby drive the switching element S*#. More specifically, when the operation signal g*# is a turn-on command, the drive control section 34 turns off the discharge switching element 32 and turns on the constant-current switching element 26. On the other hand, when the operation signal g*# is a turn-off command, the drive control section 34 turns off the constant-current switching element 26 and turns on the discharge switching element 32.

In the period when the constant-current switching element 26 is turned on, the voltage applied to the open/close control terminal (gate) is operated such that the amount of voltage drop (voltage Vm of the terminal T2) of the constant-current resistor 24 is controlled to be a specified value. Thus, the current flowing in the constant-current resistor 24 is rendered to be constant. In addition, the gate of the switching element S*# can be charged under constant-current control.

Under the constant-current control using the constant-current switching element 26, the gate voltage of the switching element S*# converges on the terminal voltage VH of the DC voltage source 22. When the gate voltage approximates a conversion value, the controllability of the constant-current control is lowered. The reason for this is as follows. Specifically, a gate voltage Vge will have a value equal to or more than a value obtained by subtracting an amount of voltage drop of the constant-current resistor 24 and a minimum amount of voltage drop of the constant-current switching element 26 from the terminal voltage VH. Then, depending on the control of the gate voltage by the constant-current switching element 26, the amount of voltage drop of the constant-current resistor 24 can no longer be controlled to a specified value. Therefore, the terminal voltage VH is set to a value that will not lower the controllability of the constant-current control, until the gate voltage where a saturation current associated with the gate voltage is a maximum value of current that flows in the switching element S*# on a normal drive of the switching element S*#.

Further, the terminal T4 is connected to the terminal T5 via a series connection of a Zener diode 40 and a clamp switching element 42. The Zener diode 40 has a breakdown voltage that restricts the gate voltage of the switching element S*# to an extent that an excessive current will not flow in the switching element S*#.

Furthermore, the terminal T4 is connected to the terminal T5 via a soft shutdown resistor 44 and a soft shutdown switching element 46.

On the other hand, the switching element S*# includes a sense terminal St. The sense terminal St outputs minute current having a correlation with the current (collector current) that passes between an input terminal (collector) and an output terminal (emitter) of the switching element S*#. Also, the sense terminal St is electrically connected to the emitter of the switching element S*# via a series connection of resistors 48 and 50. Thus, the current outputted from the sense terminal St results in voltage drop in the resistor 50. The amount of voltage drop in the resistor 50 can be regarded as being an electrical state quantity that has a correlation with the current passing between the input terminal and the output terminal of the switching element S*#.

The voltage drop (voltage Vsd at a connecting point of the resistors 48 and 50) in the resistor 50 is applied to a non-inverting input terminal of a comparator 52 via a terminal T7. On the other hand, a reference voltage Vref of a reference power supply 54 is applied to the inverting input terminal of the comparator 52. Thus, when the current passing between the collector and the emitter of the switching element S*# becomes equal to or more than an overcurrent threshold Ith, the output signal of the comparator 52 is inverted from logical "L (low level)" to logical "H (high level)".

The signal indicating logical "H" outputted from the comparator 52 is applied to the clamp switching element 42, while also being applied to a delay circuit 56. When the signal indicating logical "H" is inputted to the delay circuit 56 for a predetermined period, the delay circuit 56 outputs a failure signal FL. The failure signal FL turns on the soft shutdown switching element 46 to forcibly turn off the switching element S*#, or instructs the drive control section 34 to stop the driving of the constant-current switching element 26 and the discharge switching element 32.

With the configuration as set forth above, when overcurrent flows through the switching element S*#, the clamp switching element 42 is turned on first to turn on the Zener diode 40, thereby reducing the gate voltage of the switching element S*#. Thus, the current (collector current) flowing in the switching element S*# can be restricted. After that, when the overcurrent continues for a predetermined period, the soft shutdown switching element 46 is turned on.

When the soft shutdown switching element 46 is turned on, the electric charge of the switching element S*# is discharged via the soft shutdown resistor 44 and the gate resistor 30. Here, the soft shutdown resistor 44 increases the resistance of a discharge path. The resistance is increased based on a concept of avoiding an undue surge under the condition where the collector current is excessively large. Specifically, under such a condition, the undue surge would be caused upon increase of the speed of switching the switching element S*# from an on-state to an off-state, or, upon increase of the speed of shutting down between the collector and the emitter. Therefore, if the collector current is likely to become equal to or more than the overcurrent threshold Ith, the gate of the switching element S*# is discharged via a path whose resistance is larger than that of the discharge path including the gate resistor 30 and the discharge switching element 32.

In the present embodiment, the clamp circuit including the clamp switching element 42 and the Zener diode 40 has a clamp voltage which is set to a value for restricting the current flowing in the switching element S*# to not more than a specified value (≥overcurrent threshold Ith). Due to this, the clamp voltage becomes higher than the gate voltage where a saturation current associated with the gate voltage is a maximum current that flows in the switching element S*# on a normal drive of the switching element S*#.

The failure signal FL is outputted to the low-voltage system (control unit 18) via a terminal T8. Upon reception of the failure signal FL, a failure processing section 14a shown in FIG. 1 shuts down the inverter INV and the step-up converter CNV. The failure processing section 14a may have a configuration shown such as in FIG. 3 of JP-A-2009-060358.

When the switching element S*# on one of the high-potential side and the low-potential side is turned on, if the switching element S*# on the other of the high-potential side and the low-potential side (reverse arm side) is kept in the on-state, short-circuit current flows in them, which may excessively increase current that flows in the switching element S*#. This abnormality can be resolved by the clamp switching element 42 being turned on. However, due to a response delay that occurs when the clamp switching element 42 becomes in the on-state, excessively large current may temporarily flow in the switching element S*#. In the present embodiment, a switching to the on-state of the switching element S*# is performed in the manner shown in FIG. 3.

Figure 3:
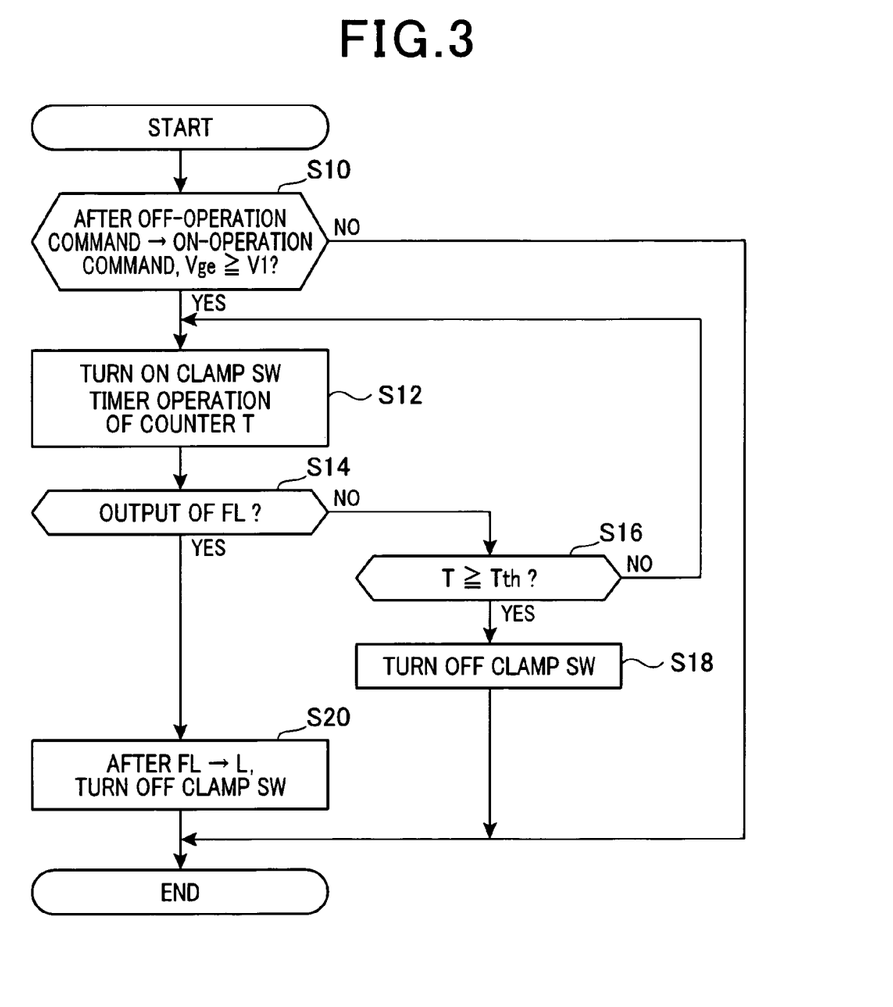
FIG. 3 is a flow chart showing a procedure of an on-operation process of the drive unit according to the first embodiment.

FIG. 3 shows a procedure of an on-operation process of the switching element S*# according to the present embodiment. This process is repeatedly performed by the drive control section 34 at a predetermined interval.

In a series of steps in FIG. 3, first, at step S10, after the operation signal S*# for the switching element S*# to be driven is switched from the off-operation command to the on-operation command, the drive control section 34 judges whether or not the voltage Vge between the gate and the emitter becomes equal to or more than a prescribed voltage V1 (V1>0). The purpose of the process is to judge a start timing of an operation process to turn on the clamp switching element 42. Here, the start timing is not set to a timing when the operation signal S*# is switched from the off-operation command to the on-operation command, but is based on a plurality of conditions, in order to increase a resistance to noise on the start timing. It is preferable that the prescribed voltage V1 is lower than a threshold voltage Vth at which the switching element S*# is turned on.

If the judgment in step S10 is affirmative (YES), at step S12, the drive control section 34 performs an on-operation process to turn on the clamp switching element 42, and performs a timer operation process to measure a time during which the clamp switching element 42 is turned on through a counter T. Subsequently, at step S14, the drive control section 34 judges whether or not the failure signal FL is outputted. The purpose of the process is to judge whether or not excessively large current flows in switching element S*# due to turning on the switching element S*#. If the judgment in step S14 is negative (NO), at step S16, the drive control section 34 judges whether or not the counter T is equal to or more than the threshold time Tth. Here, the threshold time Tth is set to be equal to or more than a time required for the failure signal FL to be outputted based on the voltage Vsd applied to the terminal T7 at the time of abnormality where excessively large current flows in the switching element S*# in association with a switching to the on-state of the switching element S*#. If the judgment in step S16 is negative (NO), the drive control section 34 proceeds to step S12. On the other hand, if the judgment in step S16 is affirmative (YES), the drive control section 34 proceeds to step S18 and then performs an off-operation process to turn off the clamp switching element 42. This is based on the fact that, if the failure signal FL is not outputted for the threshold time Tth, it is able to judge that there is no abnormality in which excessively large current flows in the switching element S*#.

If the judgment in step S14 is affirmative (YES), at step S20, the drive control section 34 confirms that the failure signal FL is inverted to logical "L" and subsequently performs an off-operation process to turn off the clamp switching element 42. That is, if the failure signal FL is outputted (inverted to logical "H"), the soft shutdown switching element 46 is controlled to be turned on. Due to this, the drive control section 34 confirms an operation of the soft shutdown switching element 46 depending on the fact that the failure signal FL that is inverted to logical "L", and subsequently performs the off-operation process to turn off the clamp switching element 42. When the failure signal is outputted, the abnormality is notified to the control unit 18, and the inverter INV and the step-up converter CNV are shut down.

Figure 4:
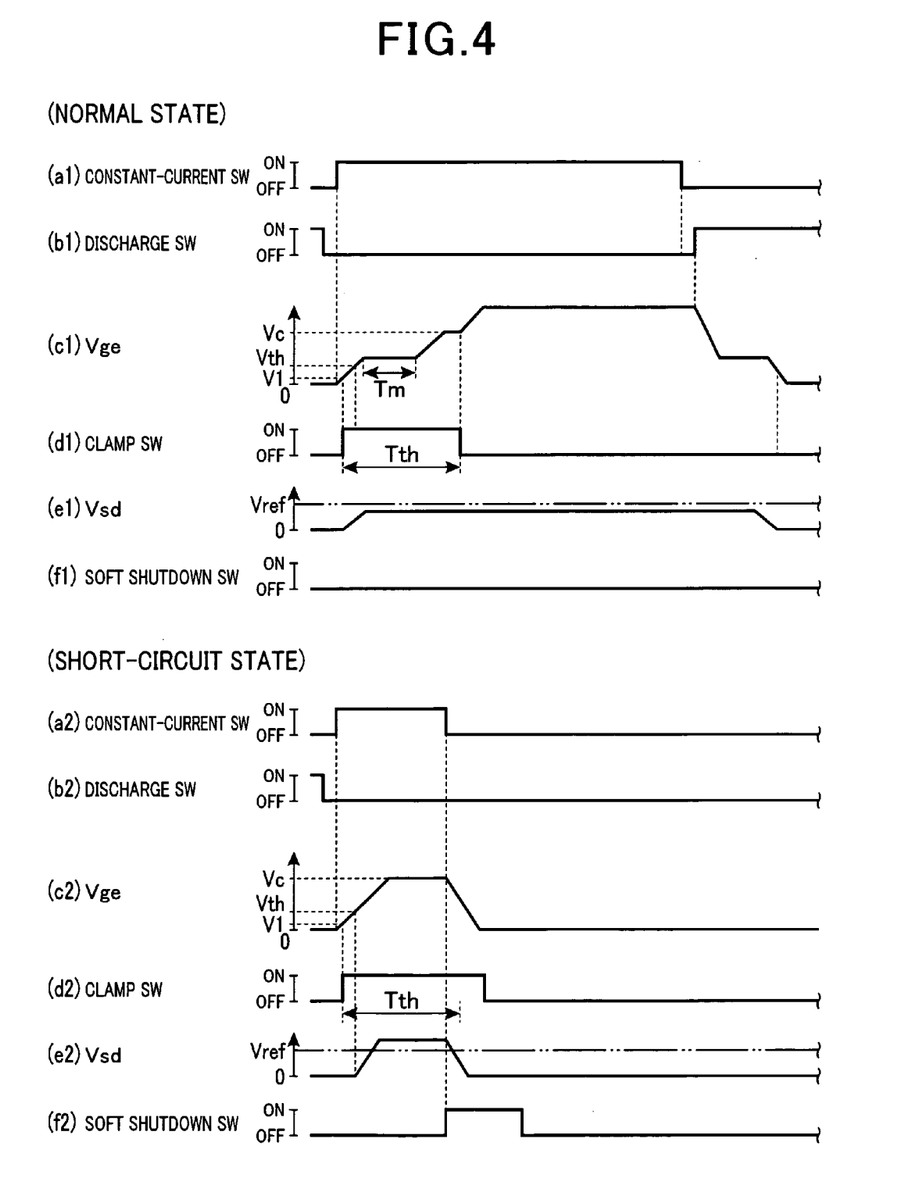
FIG. 4 is a timing chart showing a state of an on-operation process of the drive unit according to the first embodiment.

FIG. 4 shows a switching process to turn on and off the switching element S*# according to the present embodiment.

In FIG. 4, (a1) to (f1) show a case of a normal state, where (a1) is a transition in an operation state of the constant-current switching element 26, (b1) is a transition in an operation state of the discharge switching element 32, (c1) is a transition in the voltage (gate voltage Vge) between the gate and the emitter of the switching element S*#, (d1) is a transition in an operation state of the clamp switching element 42, (e1) is a transition in the amount of voltage drop (voltage Vsd) in the resistor 50, and (f1) is a transition in an operation state of the soft shutdown switching element 46.

As shown in (a1) to (f1) of FIG. 4, when the gate voltage Vge increases to the prescribed voltage V1 depending on the on-operation of the constant-current switching element 26, the clamp switching element 42 is controlled to be turned on. Due to this, the gate voltage Vge (which, as shown in (c1) of FIG. 4, subsequently increases and exceeds the threshold voltage Vth, then keeps substantially constant for a so-call "Miller period" Tm, and further subsequently increases) is restricted to a clamp voltage Vc in the order of a break down voltage in the Zener diode 40. Subsequently, when the threshold time Tth passes, the clamp switching element 42 is controlled to be turned off.

In contrast, (a2) to (f2) of FIG. 4 show a case of an abnormality (short-circuit state) where excessively large current may flow in the switching element S*#. In FIG. 4, (a2) to (f2) correspond to (a1) to (f1).

As shown in (a2) to (f2) of FIG. 4, the gate voltage Vge of the switching element S*# exceeds the threshold voltage Vth and subsequently increases to the clamp voltage Vc sharply, and not via the Miller period Tm. The gate voltage Vge does not exceed the clamp voltage Vc, because the clamp switching element 42 is controlled to be turned on. Then, when the voltage Vsd exceeds a reference voltage Vref, the soft shutdown switching element 46 is controlled to be turned on, and then, the switching element S*# is controlled to be turned off.

According to the present embodiment specifically described above, the following advantages are obtained.

(1) When the switching element S*# is turned on, the gate voltage Vge is restricted to the clamp voltage Vc which is similar to the the break down voltage in the Zener diode 40. This can reduce an occurrence of a situation where excessively large current flows in the switching element S*# with a switching to an on-state of the switching element S*#.

(2) The start timing of a process to turn on the clamp switching element 42 is set to a timing at which the gate voltage becomes equal to or more than the prescribed voltage V1 after the operation signal g*# is switched to the on-operation command. Compared with the case where the start timing is set to a timing at which the operation signal g*# is switched to the on-operation command, the number of conditions for setting the start timing can be increased and therefore, the resistance to noise on the start timing can be increased. This can reduce an occurrence of a situation where the clamp switching element 42 is controlled to be turned on early because the start timing is erroneously and early set due to noise and a time at which the threshold time Tth passes is made earlier.

(3) If the current flowing in the switching element S*# is equal to or more than the overcurrent threshold Ith with a switching to an on-state of the switching element S*#, the off-operation of the clamp switching element 42 is prohibited. This can reliably avoid a situation where current flowing in the switching element S*# becomes larger.

(4) If the current flowing in the switching element S*# is equal to or more than the overcurrent threshold Ith with a switching to an on-state of the switching element S*#, the off-operation of the clamp switching element 42 is forcibly prohibited. This can properly eliminate a situation where excessively large current flows in the switching element S*#.

Second Embodiment

Figure 5:
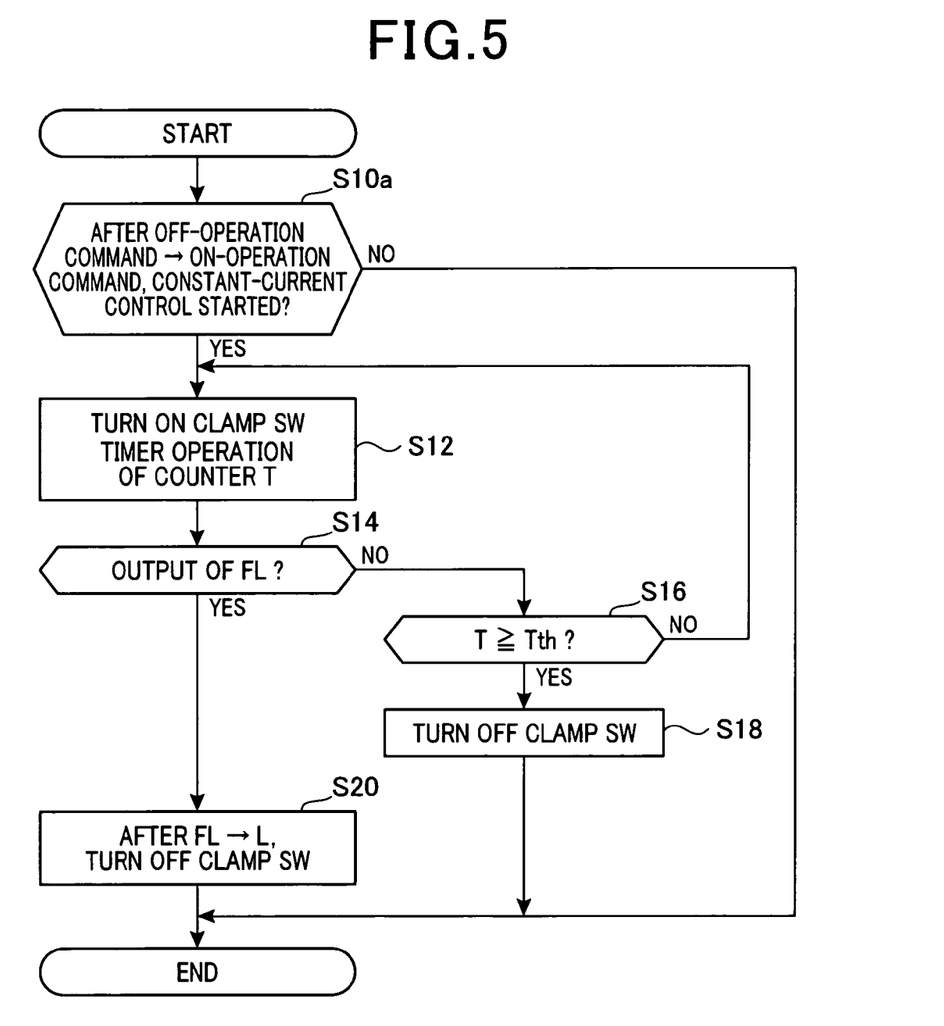
FIG. 5 is a flow chart showing a procedure of an on-operation process of the drive unit according to a second embodiment of the present invention.

Referring to FIG. 5, hereinafter is described a second embodiment, focusing on the differences from the first embodiment. In the second and the subsequent embodiments, the components identical with or similar to those in the first embodiment are given the same reference numerals for the sake of omitting unnecessary explanation.

FIG. 5 shows a procedure of an on-operation process of the switching element S*# according to the present embodiment. This process is repeatedly performed by the drive control section 34 at a predetermined interval.

In a series of steps in FIG. 5, at step 10a, after the operation signal S*# for the switching element S*# to be driven is switched from the off-operation command to the on-operation command, the drive control section 34 judges whether or not the constant-current control is started, in order to judge whether or not there is a start timing of a period during which the clamp switching element 42 is controlled to be turned on. Here, a process of a judgment on whether or not the constant-current control is started may be judged based on, for example, a change in voltage applied to the gate of the constant-current switching element 26, a change in voltage across both ends of the constant-current resistor 24, a change in potential of the drain of the constant-current switching element 26, and the like.

According to the configuration, the start timing of a process to turn on the clamp switching element S*# can be set based on the fact that a process of a switching to an on-state of the switching element S*# is actually performed.

Third Embodiment

Figure 6:
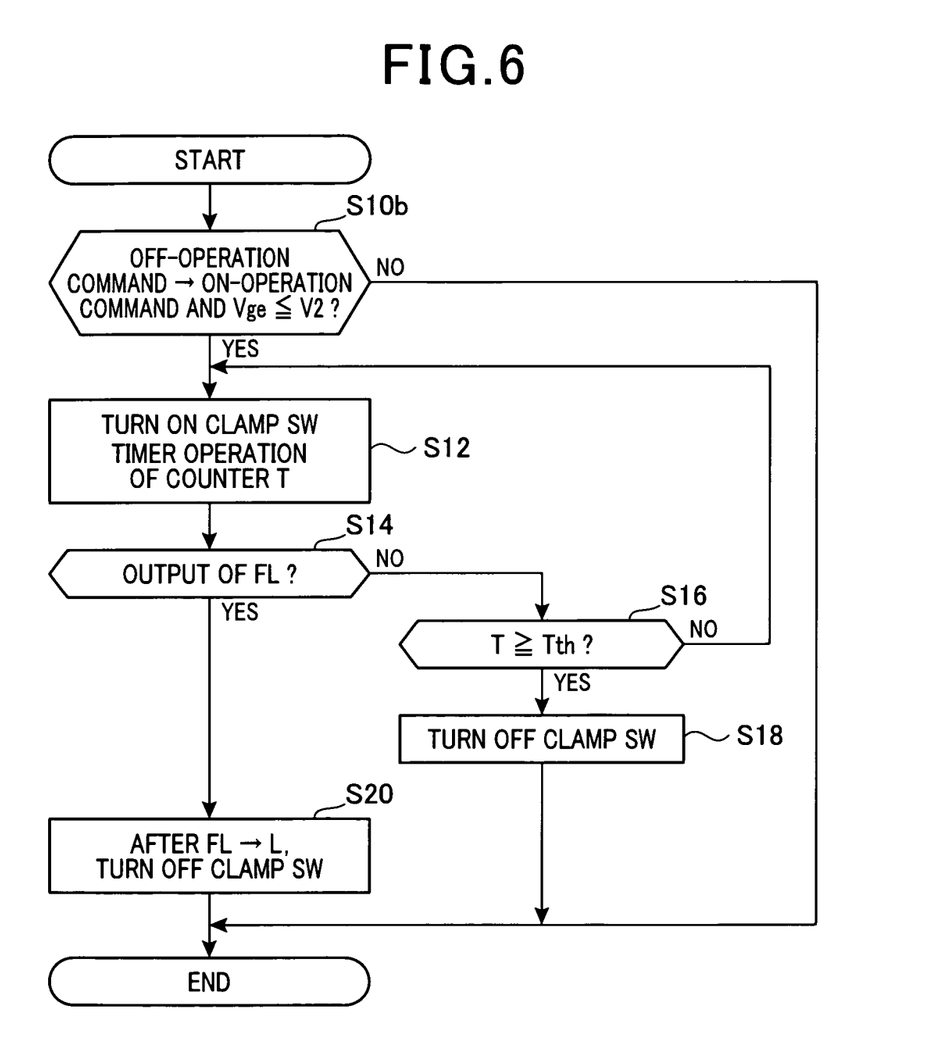
FIG. 6 is a flow chart showing a procedure of an on-operation process of the drive unit according to a third embodiment of the present invention.

Referring to FIG. 6, hereinafter is described a third embodiment, focusing on the differences from the first embodiment.

FIG. 6 shows a procedure of an on-operation process of the switching element S*# according to the present embodiment. This process is repeatedly performed by the drive control section 34 at a predetermined interval.

In a series of steps in FIG. 6, at step 10b, the drive control section 34 judges whether or not a logical conjunction of two conditions (x1) and (x2) is true, where (x1) is that the operation signal S*# for the switching element S*# to be driven is switched from the off-operation command to the on-operation command, and (x2) is that the gate voltage Vge is equal to or less than a predetermined voltage V2 (V2<Vth), in order to judge whether or not there is a start timing of a period during which the clamp switching element 42 is controlled to be turned on. Here, the purpose of the condition (x2) that the gate voltage Vge is equal to or less than a predetermined voltage V2 (V2<Vth) is to prevent the drive control section 34 from falsely recognizing that the operation signal S*# is the on-operation command at a timing when the operation signal S*# cannot be the on-operation command because the operation signal g*# overlaps with noise.

(Modifications)

The embodiments described above may be modified and implemented as follows.

The "start point of the predetermined period at which the clamp switching element is turned on" is not limited to the point of the timing exemplified in the above embodiments, but may be, for example, the point of the timing when a logical conjunction of two conditions (y1) and (y2) is true, where (y1) is that a start of the constant-current control is detected, and (y2) is that the gate voltage Vge is equal to or less than the predetermined voltage V2.

The start point of the predetermined period is not limited to the point of the timing when the logical conjunction of a plurality of conditions is true, but may be, for example, the point of the timing when the operation signal S*# is switched to the on-operation command.

As for the "prohibition unit", under the condition that, after a switching to the on-state of the switching element S*#, overcurrent flows in the switching element S*# with this, if a time required for the failure signal FL to being outputted is shorter than the threshold time Tth, it is not necessary to use the prohibition unit, because overcurrent flowing in the switching element S*# can be prevented anyway.

As for the "fail-safe unit", for example, if there is no function for shutting down the inverter INV and the converter CNV through the failure signal FL, for example, while a given evacuation operation of the vehicle is continued, the soft shutdown switching element 46 is kept in the on-state. In this case, instead of always keeping the soft shutdown switching element 46 in the on-state, it is preferable that the gate and emitter of the switching element S*# are always connected by a resistor with a resistor value smaller than a resistor value of a discharge path including the discharge switching element 32 and the gate resistor 30. This can be realized by including a switching element that connects the gate and emitter of the switching element S*# outside the drive IC 20.

The "restriction unit" is not limited to the clamp circuit including the Zener diode 40 and the clamp switching element 42, but may be, for example, a circuit that produces the clamp voltage Vc using a plurality of diodes connected in series with each other instead of the Zener diode 40.

Figure 7:
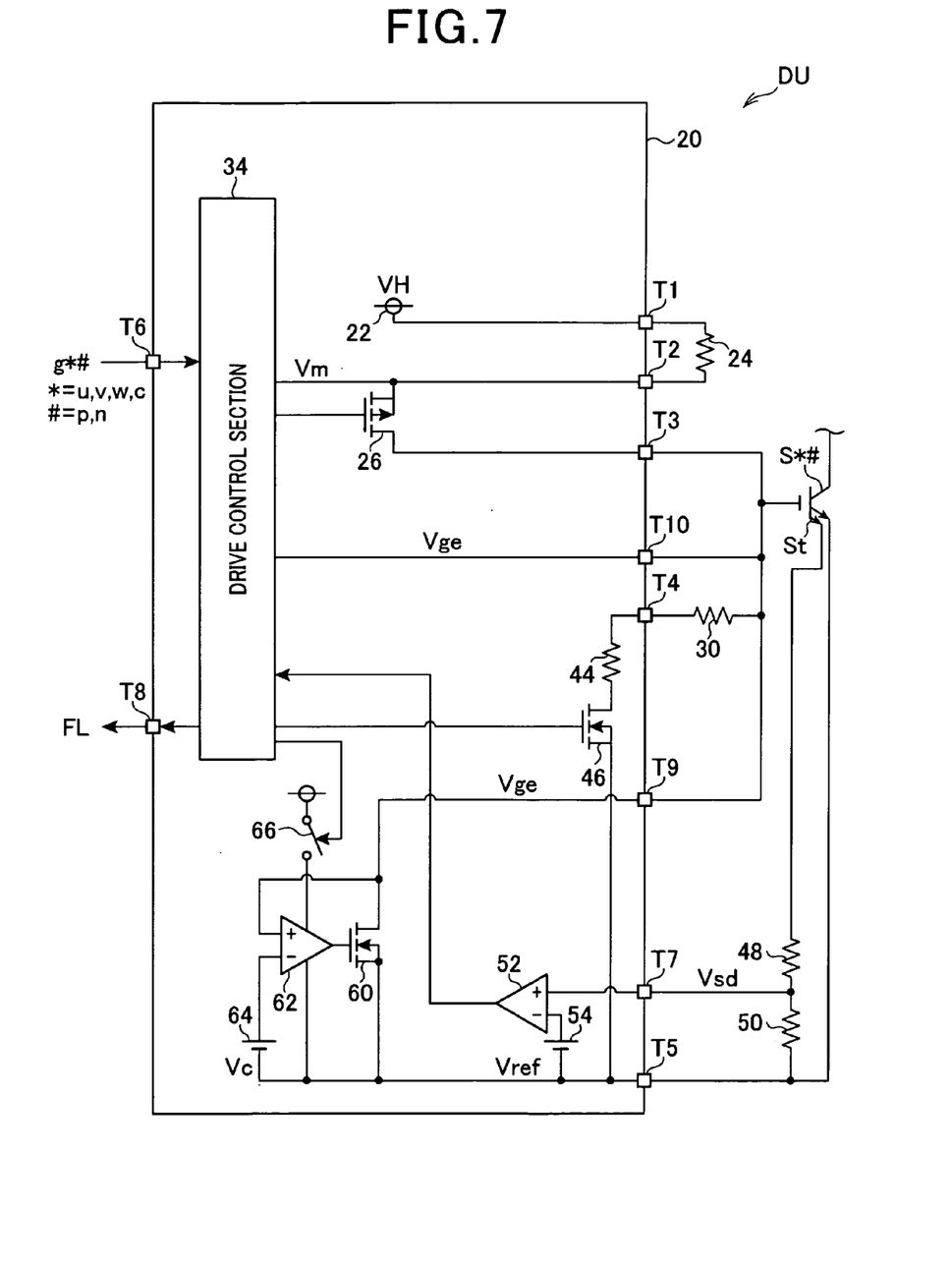
FIG. 7 is a circuit diagram illustrating a circuit configuration of a drive unit according to a modification of the embodiments.

For example, as shown in FIG. 7, the gate voltage Vge of the switching element S*# may be controlled to be the clamp voltage Vc by operating a gate voltage of an n-channel MOSFET (clamp switching element 60). FIG. 7 shows an example where (i) an output voltage of an operational amplifier 62 is applied to a gate of the clamp switching element 60, (ii) the clamp voltage Vc is applied to an inverting input terminal of the clamp switching element 60, and (iii) the gate voltage Vge of the switching element S*# is applied to a non-inverting input terminal of the clamp switching element 60 via a terminal T9. Here, a feed to the operational amplifier 62 is turned on and off by a power supply switching element 66.

Figure 8:
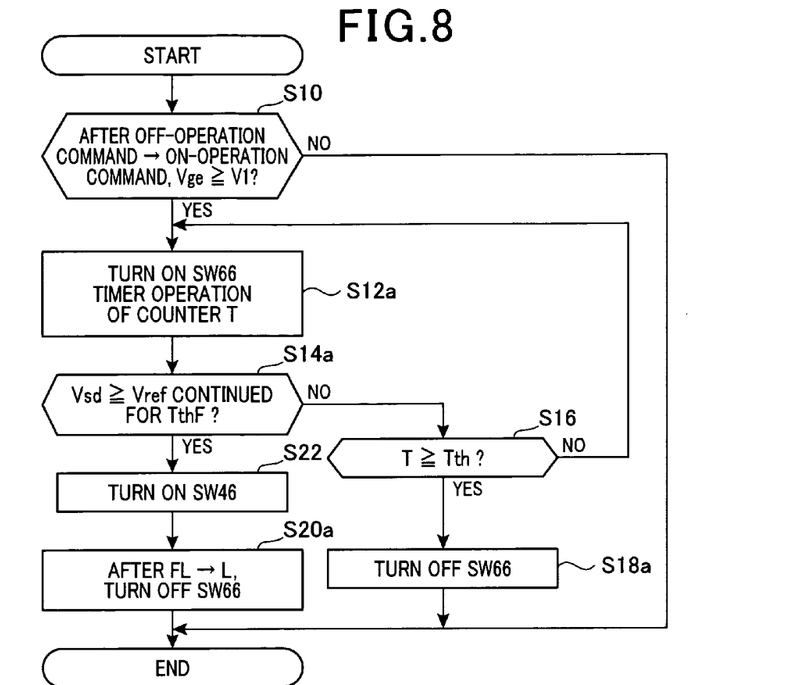
FIG. 8 is a flow chart showing a procedure of an on-operation process of the drive unit according to the modification.

FIG. 8 shows a procedure of a process performed by a drive control section 34 shown in FIG. 7. In FIG. 8, the processes identical with or similar to those in FIG. 3 are given the same reference numerals for the sake of omitting unnecessary explanation.

In a series of steps in FIG. 8, if the judgment in step S10 is affirmative (YES), at step S12a, the drive control section 34 performs an on-operation process to turn on the power supply switching element 66, and starts a timer operation through a counter T. Subsequently, at step S14a, the drive control section 34 judges whether or not a time during which the voltage Vsd is equal to or more than the reference voltage Vref is continued for a shutdown threshold time TthF. The purpose of the process is to judge whether or not the soft shutdown switching element 46 is controlled to be turned on. If the judgment in step S14a is affirmative (YES), at step S22, the drive control section 34 performs an on-operation process to turn on the soft shutdown switching element 46, and subsequently at step S20a, after the failure signal FL is inverted from logical "H" to logical "L", performs an off-operation process to turn off the power supply switching element 66. If the judgment in step S16 is affirmative (YES), the drive control section 34 proceeds to step S 18a and then performs an off-operation process to turn off the power supply switching element 66.

As the "predetermined period during which the restriction of the restriction unit is continued", in the first embodiment, in the abnormality where excessively large current flows in the switching element S*# in association with a switching to the on-state of the switching element S*#, the threshold time Tth is set to be equal to or more than a time required for the failure signal FL to be outputted based on the voltage Vsd applied to the terminal T7, but is not limited to it. It is preferable that the threshold time Tth is set to a time longer than a duration time of overcurrent that corresponds to a condition for turning on the soft shutdown switching element 46.

Figure 9:
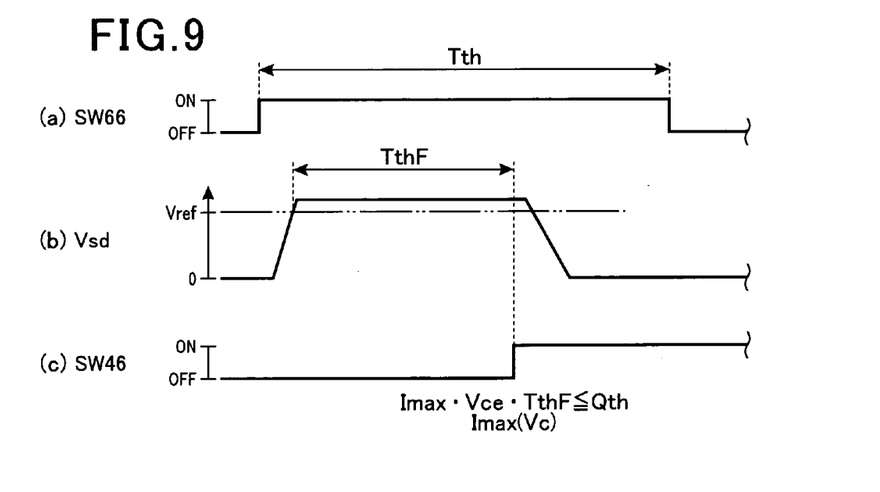
FIG. 9 is a timing chart showing a setting of a predetermined period during which restriction of a restriction unit is continued.

FIG. 9 shows a case of an example in FIG. 7 and FIG. 8. In FIG. 9, the threshold time Tth is longer than the shutdown threshold time TthF. As shown in FIG. 9, the clamp voltage Vc is set such that a product of Imax, Vice, and TthF is equal to or less than Qth (Imax×Vce×TthF≤Qth), where Imax is maximum current capable of flowing in the switching element S*#, Vice is collector-emitter voltage, TthF is shutdown threshold time, and Qth is allowable maximum amount of heat generation.

As for the "a method for monitoring the gate voltage Vge", in FIG. 7, the gate voltage Vge may be monitored based on the potential between the constant-current switching element 26 and the switching element S*# (terminal T3) as shown in FIG. 2. As shown in FIG. 7, if the drive IC 20 is provided with a terminal T10 for monitoring the gate voltage Vge separately, the drive IC 20 becomes more versatile. For example, if the number of switching elements S*# driven by the single drive unit DU is increased, the constant-current switching element 26 contained in the drive IC 20 may be insufficient in rated current, heat resistance performance, and the like.

Figure 10:
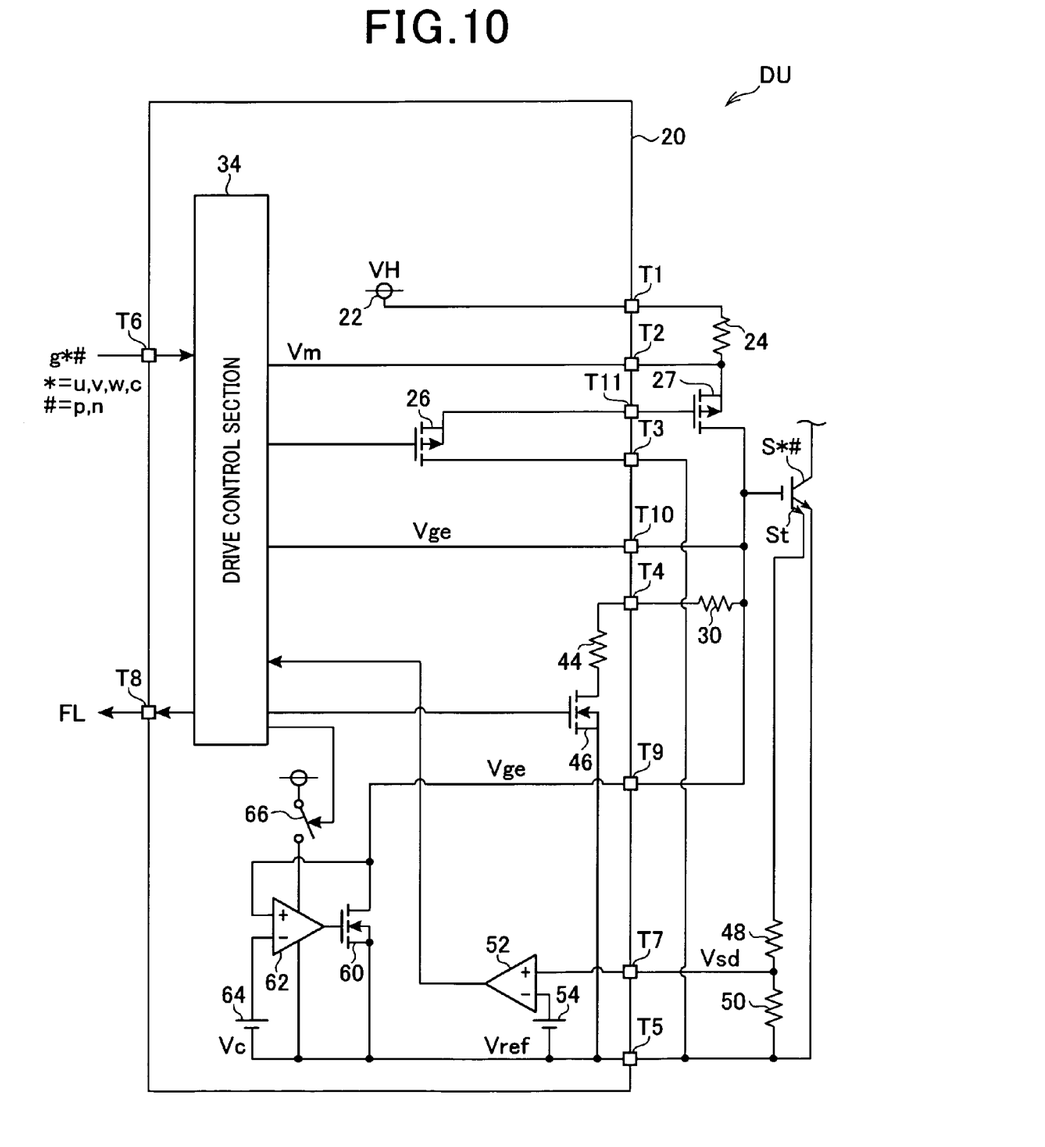
FIG. 10 is a circuit diagram illustrating a circuit configuration of a drive unit according to another modification of the embodiments.

FIG. 10 shows the other example of a drive unit DU that is provided with an external constant-current switching element 27. In the drive unit DU, the constant-current switching element 26 built in the drive IC 20 is used for driving the external constant-current switching element 27. This enables the drive IC 20 to be more versatile. In this case, the terminal T3 and the emitter of the switching element S*# are short-circuited, and therefore, the terminal T3 is not used for monitoring the gate voltage Vge. For more versatile drive IC 20, it is preferable to include the terminal T3.

The "switching elements to be driven" are not limited to IGBTs, but power MOSFETs may be usable. The power MOSFETs may be not only n-channel MOSFETs but also p-channel MOSFETs. However, in this case, each power MOSFET is turned on when the potential of the open/close control terminal (gate potential) is lowered with respect to the potential at either one of the ends (source potential) of the current flow path. Accordingly, each of the switching elements to be driven is turned on when "negative" electric charge is charged to the gate.

The "power conversion circuit" that is composed of the switching element to be driven has been a DC conversion circuit (inverter INV) including a high-potential side switching element and a low-potential side switching element to selectively connect the terminal of a rotary machine to the positive and negative poles of a DC power supply, and the converter CNV including a high-potential side switching element and a low-potential side switching element. Alternatively to this, the conversion circuit may be a step-down converter which steps down the voltage of the high-voltage battery 12 for application to the low-voltage battery 16. In this case as well, if the step-down converter is provided with a series connection of a high-potential side switching element and a low-potential side switching element, a switching to an on-state of the switching element S*# may make it easier for a rapid and excessive current to flow in the switching element S*#. Due to this, the utility value of the overcurrent protective function is particularly increased.

In FIG. 2, it is preferable that the cathode of the Zener diode 40 and the gate of the switching element S*# are short-circuited, but not via the gate resistor 30, so that the clamp voltage is controlled with high accuracy.

The motor generator 10 is not limited to the vehicle's main machine, but may be a generator installed in a series hybrid vehicle.

The present invention may be embodied in several other forms without departing from the spirit thereof. The embodiments and modifications described so far are therefore intended to be only illustrative and not restrictive, since the scope of the invention is defined by the appended claims rather than by the description preceding them. All changes that fall within the metes and bounds of the claims, or equivalents of such metes and bounds, are therefore intended to be embraced by the claims.

What is claimed is:

1. A drive circuit for a switching element, comprising:
a constant-current control unit that performs a constant-current control for charging an open/close control terminal of a switching element to be driven which is a voltage-controlled switching element with electric charge for turning on the switching element; and
a restriction unit that restricts, to a reference voltage, a voltage between the open/close control terminal and a first end of a pair of ends of a current flow path of the switching element for a predetermined period following a start of the constant-current control within a charging process period during which the open/close control terminal is charged with the electric charge such that the switching element is turned on; wherein:
the restriction unit starts to restrict based on a condition that at least two physical quantities, following an input timing of a command for turning on the switching element, change in association with the command;
the constant-current control unit includes a series connection of a constant-current resistor and a constant-current switching element which connected between the open/close control terminal and a direct current voltage source, and an operation unit that operates the open/close control terminal of the switching element such that an amount of voltage drop in the constant-current resistor is controlled to a target value, and
the physical quantities include at least one of a voltage in the open/close control terminal of the switching element, an amount of voltage drop between both ends of the constant-current resistor, and a potential in an input terminal and an output terminal of the constant-current switching element.

2. The drive circuit according to claim 1, wherein
the physical quantities further include a detection value of the voltage between the open/close control terminal of the switching element and the first end of the pair, and
the condition includes a condition that the detection value is equal to or more than a prescribed value which is more than zero.

3. The drive circuit according to claim 1, wherein
the physical quantities further include a detection value of the voltage between the open/close control terminal of the switching element and the first end of the pair, and
the condition includes a condition that the detection value is equal to or less than a prescribed value.

4. The drive circuit according to claim 2, wherein
the physical quantities further include an operation signal of the switching element, and
the condition includes a condition that the operation signal becomes a command for turning on the switching element.

5. The drive circuit according to claim 1, wherein
the restriction unit starts to restrict based on a condition that a detection value of the voltage between the open/close control terminal of the switching element and the first end of the pair is equal to or more than a prescribed value which is more than zero.

6. The drive circuit according to claim 1, further comprising:
a current detection unit that detects current flowing in the switching element, and
a prohibition unit that, if the current detected by the current detection unit is equal to or more than a threshold current, prohibits the restriction unit from releasing its restriction after the predetermined period passes.

7. The drive circuit according to claim 1, further comprising:
a current detection unit that detects current flowing in the switching element, and
a fail-safe unit that forcibly turns off the switching element, if the current detected by the current detection unit is equal to or more than a threshold current.

8. The drive circuit according to claim 7, wherein
the fail-safe unit forcibly turns off the switching element, if a state where the detected current is equal to or more than a threshold current is continued for a prescribed time, and
the predetermined period is set to a time longer than the prescribed time.

9. The drive circuit according to claim 1, wherein
the reference voltage is set to be more than the voltage between the open/close control terminal of the switching element and the first end of the pair, where a saturation current associated with the voltage is a maximum current permitted to flow in the switching element on a normal drive of the switching element.

10. The drive circuit according to claim 9, further comprising:
a current detection unit that detects current flowing in the switching element, and
a fail-safe unit that forcibly turns off the switching element, if a state where the detected current is equal to or more than a threshold current is continued for a prescribed time, wherein
the reference voltage is set such that, when the voltage between the open/close control terminal of the switching element and the first end of the pair is set to the reference voltage, an amount of heat generation, which is generated due to a flow of a maximum current capable of flowing in the switching element for the prescribed time, is equal to or less than allowable maximum amount of heat generation.

11. The drive circuit according to claim 1, wherein
the restriction unit includes:
a clamp switching element that is located between the open/close control terminal of the switching element and the either one of the pair of ends; and
an operation unit that operates a voltage applied to an open/close control terminal of the clamp switching element such that a potential between the clamp switching element and the open/close control terminal of the switching element is controlled to the reference voltage.

12. The drive circuit according to claim 1, wherein
the restriction unit includes a series connection of a Zener diode and a clamp switching element which is located between the open/close control terminal of the switching element and the first end of the pair.

13. A drive method for a switching element, comprising:
performing, at a constant-current control unit, a constant-current control for charging an open/close control terminal of a switching element to be driven which is a voltage-controlled switching element with electric charge for turning on the switching element; and
restricting, at a restriction unit, to a reference voltage, a voltage between the open/close control terminal and a first end of a pair of ends of a current flow path of the switching element for a predetermined period following a start of the constant-current control within a charging process period during which the open/close control terminal is charged with the electric charge such that the switching element is turned on; wherein:
the restriction unit starts to restrict based on a condition that at least two physical quantities, following an input timing of a command for turning on the switching element, change in association with the command;
the constant-current control unit includes a series connection of a constant-current resistor and a constant-current switching element which connected between the open/close control terminal and a direct current voltage source, and an operation unit that operates the open/close control terminal of the switching element such that an amount of voltage drop in the constant-current resistor is controlled to a target value, and
the physical quantities include at least one of a voltage in the open/close control terminal of the switching element, an amount of voltage drop between both ends of the constant-current resistor, and a potential in an input terminal and an output terminal of the constant-current switching element.

14. A power conversion circuit, comprising:
a switching element; and
a drive circuit that drives the switching elements, wherein
the drive circuit includes
a constant-current control unit that performs a constant-current control for charging an open/close control terminal of a switching element to be driven which is a voltage-controlled switching element with electric charge for turning on the switching element, and
a restriction unit that restricts, to a reference voltage, a voltage between the open/close control terminal and a first end of a pair of ends of a current flow path of the switching element for a predetermined period following a start of the constant-current control within a charging process period during which the open/close control terminal is charged with the electric charge such that the switching element is turned on; wherein:
the restriction unit starts to restrict based on a condition that at least two physical quantities, following an input timing of a command for turning on the switching element, change in association with the command:
the constant-current control unit includes a series connection of a constant-current resistor and a constant-current switching element which connected between the open/close control terminal and a direct current voltage source, and an operation unit that operates the open/close control terminal of the switching element such that an amount of voltage drop in the constant-current resistor is controlled to a target value, and the physical quantities include at least one of a voltage in the open/close control terminal of the switching element, an amount of voltage drop between both ends of the constant-current resistor, and a potential in an input terminal and an output terminal of the constant-current switching element.

15. A motor system for a vehicle, comprising:
a motor generator that is a main machine mounted on the vehicle;
a battery that supplies a direct current voltage; and
a power conversion circuit that converts the DC voltage from the battery to an alternating current (AC) voltage and supplies the AC voltage to the motor generator, which includes a switching element and a drive circuit that drives the switching element, wherein
the drive circuit includes
a constant-current control unit that performs a constant-current control for charging an open/close control terminal of a switching element to be driven which is a voltage-controlled switching element with electric charge for turning on the switching element, and
a restriction unit that restricts, to a reference voltage, a voltage between the open/close control terminal and a first end of a pair of ends of a current flow path of the switching element for a predetermined period following a start of the constant-current control within a charging process period during which the open/close control terminal is charged with the electric charge such that the switching element is turned on; wherein:
the restriction unit starts to restrict based on a condition that at least two physical quantities, following an input timing of a command for turning on the switching element, change in association with the command;
the constant-current control unit includes a series connection of a constant-current resistor and a constant-current switching element which connected between the open/close control terminal and a direct current voltage source, and an operation unit that operates the open/close control terminal of the switching element such that an amount of voltage drop in the constant-current resistor is controlled to a target value, and
the physical quantities include at least one of a voltage in the open/close control terminal of the switching element, an amount of voltage drop between both ends of the constant-current resistor, and a potential in an input terminal and an output terminal of the constant-current switching element.

16. The motor system according to claim 15, wherein
the power conversion circuit includes
a converter that converts the DC voltage from the battery to a predetermined DC voltage under drive control of the switching element through the drive circuit, and
an inverter that converts the predetermined DC voltage from the converter to the AC voltage under control of the switching element through the drive circuit.

* * * * *